United States Patent [19]

Palmer

[11] Patent Number: 4,973,381

[45] Date of Patent: Nov. 27, 1990

[54] METHOD AND APPARATUS FOR ETCHING SURFACE WITH EXCITED GAS

[75] Inventor: Shane R. Palmer, Dallas, Tex.

[73] Assignee: Texas Instruments Incorporated, Dallas, Tex.

[21] Appl. No.: 317,145

[22] Filed: Feb. 28, 1989

Related U.S. Application Data

[63] Continuation-in-part of Ser. No. 126,540, Nov. 30, 1987, abandoned.

[51] Int. Cl.⁵ .............................................. C23F 1/00
[52] U.S. Cl. ..................................... 156/643; 156/345; 118/50.1; 427/38; 315/111.31; 361/235; 376/128
[58] Field of Search .................. 156/345, 643, 646; 118/50.1; 427/34, 38; 315/111.01, 111.21, 111.31; 361/230, 235; 376/128

[56] References Cited

U.S. PATENT DOCUMENTS

| | | | |
|---|---|---|---|
| 3,437,864 | 4/1969 | Kofoid et al. | 315/111.31 |
| 4,088,926 | 5/1978 | Fletcher et al. | 315/111.21 |
| 4,609,428 | 9/1986 | Fujimura | 156/643 |
| 4,645,977 | 2/1987 | Kurokawa et al. | 315/111.21 |
| 4,662,977 | 5/1987 | Motley et al. | 156/345 |

FOREIGN PATENT DOCUMENTS 61-177728  8/1986  Japan ................................ 156/345

OTHER PUBLICATIONS

Downey et al.; "Introduction to Reactive Ion Beam Etching", Solid State Technology, Feb. 1981, pp. 121–127.

Primary Examiner—David Simmons
Assistant Examiner—Lori-Ann Johnson
Attorney, Agent, or Firm—James C. Kesterson; James T. Comfort; Melvin Sharp

[57] ABSTRACT

A system (10) is provided for etching a surface (14). A vacuum enclosure (12) is provided to create a vacuum around containers (13) and the surface to be etched (14). A pressurized gas source (16) is utilized to input gas into the containers (13). A wire coil (38) is wrapped around the containers (13) and provided with an oscillator (40) to generate radio frequency energy. The radio frequency energy excites the gas within the containers (13) which is then discharged through an output opening (46) toward the surface to be etched (14). A vacuum pump (20) is provided to evacuate the enclosure (12).

33 Claims, 1 Drawing Sheet

METHOD AND APPARATUS FOR ETCHING SURFACE WITH EXCITED GAS

This application is a continuation-in-part of application 126,540, filed Nov. 30, 1987, now abandoned.

TECHNICAL FIELD OF THE INVENTION

This invention relates in general to semiconductor devices, and in particular to a method and apparatus for etching a semiconductor surface with an excited gas.

BACKGROUND OF THE INVENTION

In the fabrication of semiconductor devices, it is frequently necessary to etch a substrate surface to form a trench or a via. To accomplish this, several different methods have been developed including barrel type etching, reactive ion etching and ion beam etching.

Barrel type etching utilizes a cylindrical tube that forms a barrel shaped container. The container is wrapped with a wire coil that is capable of emitting radio frequency energy. Gas is supplied to the container and radio frequency energy, emitted through the walls of the container, excites the gas into a plasma state which is evidenced by free electrons and ions. The surface to be etched is placed inside the container and bombarded by the plasma. There is no direction to the plasma, and, therefore, it attacks the surface equally in every direction. The surface is removed from the container after being etched to the proper depth. A primary problem with the barrel type etcher is the random directionality of the plasma, which allows no uniformity in the etching. The typical barrel etch thus resembles a dished out trench.

Reactive ion etching allows more directionality to the plasma. In this type of etching, two parallel plates are electrically connected to a RF energy source. One plate is usually biased with a relatively high voltage (100-1000 volts) to accelerate the plasma toward a surface. Gas enters a container in which the plates are positioned, and the RF energy excites the gas to form plasma. Due to the applied voltage, the ions formed within the plasma obtain a directionality which is aimed at the surface to be etched. This etcher may damage the surface due to the acceleration of the ions caused by the high voltage. Lattice defects, impurity sites and thermal damage to the surface are typical of the reactive ion etcher.

A third technique typically used is ion beam etching. An ion beam etcher comprises a cylindrical container through which gases are excited into a ionized state by an electric filament. An electric potential is used to accelerate and aim the ions at the surface to be etched. The ion beam etcher uses almost pure physical etching, in contrast to the physical and chemical etching of the barrel and the reactive ion etchers, and can be related to a similar reaction obtained by throwing a billiard ball at a surface. The ion beam etcher is the most directional of the three etchers, but is also the most damaging to the surface. Thus, a need exists for a low cost method and apparatus for directional etching without resulting damage to the surfaces which are etched.

SUMMARY OF THE INVENTION

The present invention disclosed and claimed herein provides a method and apparatus for an excited gas etcher which substantially eliminates or reduces problems associated with prior plasma etching devices. Specifically, the present invention allows directional etching of a surface without unwanted damage to the surface.

In accordance with one aspect of the present invention, an apparatus for preparing excited gas to etch a surface is provided. The apparatus comprises an enclosed container having sidewalls and a first and second end. The container has an input opening in the first end for receiving a pressurized gas and an output opening in the second end for directing the gas at the surface after it is excited. The gas is excited into a plasma state within the enclosed container by radio frequency (RF) energy. After the gas reaches a plasma state, it reforms into an excited gas (the electrons and ions are reunited but there is still instability within the molecules) just prior to exiting through the output opening toward the surface to be etched.

In accordance with another aspect of the present invention, the enclosed container comprises treated glass or quartz. The container is preferably shaped similar to a bottle with an inwardly sloping neck forming the output opening. A wire coil is wrapped around the container and connected to an oscillator to provide RF energy. The container is placed in a vacuum enclosure which is lowered in pressure to a range of $10^{-4}$ to $10^{-5}$ Torr by a vacuum pump. A pressure differential is created from a higher pressure inside the container to a lower pressure inside the enclosure. After the gas is excited by the RF energy, it is accelerated through the output opening by the pressure differential. The accelerated and excited gas is aimed at the surface to be etched.

It is a technical advantage of the present invention that it operates in a low pressure environment which removes any stray particles that can interfere with the etching process. Thus etching time is reduced. It is a further technical advantage that the present invention provides directionality without damaging the surface to be etched. It is a still further technical advantage in that the present invention can be made from low cost materials.

BRIEF DESCRIPTION OF THE DRAWINGS

For a more complete understanding of the present invention and for further advantages thereof, reference is now made to the following Detailed Description taken in conjunction with the accompanying Drawings in which.

DETAILED DESCRIPTION OF THE INVENTION

Figure 1:
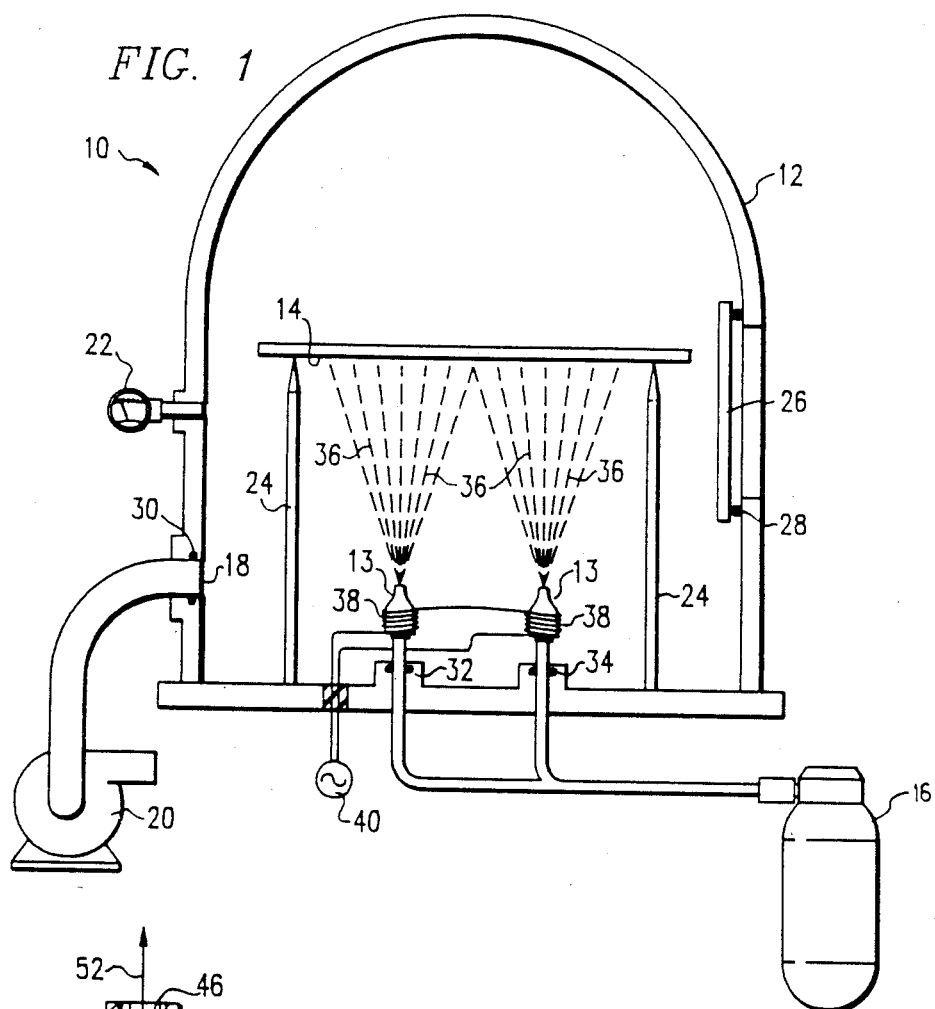
FIG. 1 is plan view of a system according to the preferred embodiment of the present invention.
Figure 2:
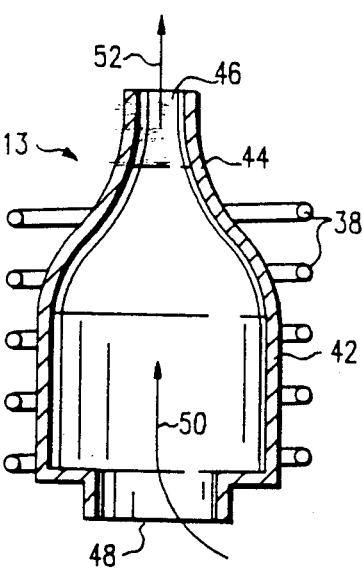
FIG. 2 is a cross-sectional view of the container in accordance with the preferred embodiment of the present invention.

In FIGS. 1 and 2, like items are identified by like and corresponding numerals for ease of reference. Referring to FIG. 1, a plan view of a system utilizing the preferred embodiment of the present invention is generally identified by the reference numeral 10. The system 10 comprises a vacuum enclosure 12, containers 13, a surface to be etched 14 and a pressurized gas source 16. The vacuum enclosure 12 is evacuated through an opening 18 by a vacuum pump 20. A pressure gauge 22 may be provided for monitoring the pressure inside the enclosure 12. The surface to be etched 14 is held by support posts 24.

Access to the enclosure 12 may be provided by a port 26. The port 26 is sealed to ensure vacuum integrity by a seal 28. The opening 18 and the containers 13 are also sealed through the enclosure 12 to maintain the vacuum integrity by seals 30, 32 and 34 respectively.

The vacuum within enclosure 12 is in the range of $10^{-4}$ to $10^{-5}$ Torr. This low pressure creates a pressure differential between the enclosure 12 and the interior of the containers 13. The pressure differential causes excited gas within the containers 13 to be drawn out of the containers 13 toward the surface to be etched 14 as illustrated by lines 36.

The containers 13 are individually wrapped by a wire coil 38. The wire coil 38 may be any appropriate material, such as copper wire. The wire coil 38 is connected to an oscillator 40 for providing radio frequency (RF) energy. The RF energy from the oscillator 40 is transmitted through the containers 13. As gas from the pressurized gas container 16 enters the containers 13, RF energy excites the gas to a plasma state.

Referring to FIG. 2, the container 13 is depicted in cross-sectional view. The container 13 may be formed from any appropriate material, for example, quartz or treated glass such as Pyrex. The container 13 preferably has a shape resembling a bottle with sidewalls 42 tapering inward to form a neck 44. The neck 44 terminates in an output opening 46.

Opposite the output opening 46 is an input opening 48. The input opening 48 is dimensionally larger than the output opening 46. Testing has shown a desirable output opening size to be approximately forty microns in diameter. The container 13 may be between two and four centimeters in diameter.

A pressurized gas, such as carbon tetrachloride ($CCl_4$) or any halogenated gas, is placed within the container 13 through the input opening 48 as illustrated by the arrow 50.

RF energy is transmitted through the container 13 by the wire coil 38. The RF energy excites the gas within the container 13 into a plasma state evidenced by free electrons and ions. Prior to exiting through the output opening 46, a majority of the plasma ions are reunited with their electrons to form an excited gas. The excited gas is accelerated through the output opening 46 in the direction of the arrow 52 by the pressure differential as discussed above. When the excited gas contacts the surface to be etched 14, the excited electrons in the gas molecules tend to remix with molecules of the surface material to form volatile compounds which are then removed from the chamber by vacuum pumps. Since the container 13 is within the vacuum enclosure 12, reformed non-bound molecules will tend to drift away from the surface 14 by gravity.

Referring to FIG. 2, the preferred size of the opening 46 to achieve the desired excited species can be determined by considering the mean atomic velocity of the species. For purposes of explanation, this exemplary embodiment will be described using a mixture of $CCl_4$ and $O_2$ as the species, with a pressure in the container 13 of 100 mTorr, a typical pressure for RF excited plasmas. The number N of molecules or atoms escaping from an opening 46 having an area A can be determined as follows:

$$N = (n/4) * v * A \qquad (1)$$

where n is the number of molecules/atoms per unit volume, and where v is the mean velocity of the molecules or atoms. The mean velocity v can be determined from the ideal gas law, using an exemplary temperature of 50 degrees Celsius:

$$v = [(3kT)/m]^{\frac{1}{2}} \qquad (2)$$

where k is Boltzmann's constant ($1.3807 \times 10^{-23}$ joule/degrees Celsius). The mean atomic mass of a mixture of $O_2$ and $CCl_4$ is 66.7 amu for a 1:3 ratio of $O_2$ to $CCl_4$. It is observed for this embodiment that the system is limited by the pumping capacity to 100 sccm of inlet gas, the velocity v times the area A must be less than or equal to 100 $cm^{-3}$/minute, or 1.67 $cm^{-3}$/second. Referring to equation (2):

$$[(3kT)/m]^{\frac{1}{2}} * A <= 1.67 \ cm^{-3}/second \qquad (3)$$

Solving for the radius r of the opening 46, for the case of a 1:3 gas ratio, r will be on the order of 40 microns. This size is within the ability of conventional manufacturing techniques.

It should be noted that other species of etchant, as well as other operating conditions, may require a different size opening 46 in container 13 for optimal use of the invention. For such other conditions and species, the above method of calculation can of course be used, modifying the parameters in the calculations as appropriate.

Although not shown, the wire coil 38 may continue around the neck 44 of the container 13. A direct current (DC) voltage bias may then be applied to the RF energy which will help keep the plasma in the center of the container 13. The RF energy will be focused through the neck 44 and the output opening 46 so the amount of the excited gas coming through the opening 46 may be controlled. Alternatively, a separate wire coil with a DC bias may be installed around the neck 44 to produce the same control over the amount of excited gas that exits the output opening 46. The coil 38 may also be used to adjust the focus of the exiting beam to the surface to be etched. The inside of the neck 44 and the output opening 46 of the container 13 may be provided with a protective coating, such as silicon carbide, to help prevent etching or destroying of the container 13 during operation of the system 10.

It is to be understood that the number and orientation of the containers 13 may be varied as desired. The containers 13 may aim the excited gas at the surface to be etched 14 from any angle (the surface to be etched 14 may be reoriented as appropriate). It should be noted that this independent positioning of the orientation of containers 13 provides additional benefits of the invention. A common problem in the plasma etching is the uniformity of the etch across the surface 14. Prior methods of addressing the uniformity have included the adjustment of the flow rate of the etchant species, adjustment of the energy (in this case RF energy), as well as selection of different etchant species. However, such prior methods of adjustment often result in the reduction of the etch rate, or in the change of another etch result such as anistropy or selectivity, in order to achieve the desired uniformity. According to the method and apparatus of the invention, however, the independent orientation of the containers 13 allows for adjustment of the uniformity of the etch independently from the parameters conventionally adjusted as described hereinabove. For example, if the center of the surface 14 is being etched more slowly than the edges of surface 14, the containers may be aimed near the center of surface 14, and partially away from the edges, in order to increase the etching thereat. In addition, where an array of containers 13 are provided, certain ones of the containers 13 may have their gas inlet shut off, so that a pattern of active containers 13 defines the uniformity of the etch across surface 14. A further alternative technique according to the invention for adjusting the uniformity of the etch is to provide an array of potential locations for containers 13 in the system. Containers 13 may then be installed within the array of potential locations, so that each of the potential locations either has or does not have a container 13 thereat, with such installation done in order to provide the desired uniformity. Combinations of the techniques described herein may, of course, further adjust the uniformity of the etch. It should be noted that, since these techniques do not adjust the inlet gas flow rates, energy source, or species type for purposes of uniformity, the uniformity of the etch may be adjusted independently from the other etch parameters such as etch rate, anisotropy, and selectivity. Conversely, according to the invention, the etch rate, anisotropy and selectivity may be optimized without regard to uniformity, as the apparatus of the invention can independently adjust the uniformity of the etch. Also, the wire coil 38 may be wrapped around several containers 13 rather than around each container 13 individually. Wrapping several containers 13 may detract somewhat from the efficiency of the system 10.

It should further be noted that additional flexibility is provided according to the invention by way of adjustment of the position of the containers 13 from the surface 14 to be etched. This adjustment in the distance that the excited species is to travel can be done to select a particular excited species from the mixture in order to achieve improved selectivity of the etch between the material of the layer that is to be etched and the materials underlying the layer and also used for masking. According to the invention, the distance between the openings 46 and the surface 14 can be determined in such a manner as to optimize the number of atoms which are in their excited state when reaching surface 14, prior to recombination.

the desired distance between opening 46 and surface 14 can be calculated for a given species for such optimization. Assuming a Maxwell-Boltzmann distribution of the species in the container 13, at a pressure of 500 mTorr, the average translational velocity of an atom of the gas can be estimated as follows:

$$v = [(8kT)/(\pi m)]^{\frac{1}{2}} = (1.03\ E2)(Z^{-\frac{1}{2}})(T^{\frac{1}{2}}) \quad (4)$$

where k is Boltzmann's constant, T is the average temperature of the species, m is the mass of the species and Z is the total atomic massa unit number of the species. For this embodiment, the molecular ion temperatures for the species in a plasma condition is of interest; such temperatures are generally on the order of 500 to 1000 degrees Kelvin, depending upon the size of container 13, the gas pressure and flow, the geometry of container 13, and the location of the species and the RF power input to container 13. Table I shows, in tabular form, the mean velocity v for several species at 500 to 1000 degrees Kelvin.

TABLE I

| species | Z | mean velocity, v (m/sec) | |
|---|---|---|---|
| | | 500 deg K. | 1000 deg K. |
| O | 16 | 575 | 814 |
| OH | 17 | 559 | 789 |
| F | 19 | 528 | 747 |
| CO | 28 | 435 | 616 |
| CF | 31 | 413 | 585 |
| O2 | 32 | 407 | 575 |
| Cl | 35 | 389 | 550 |
| F2 | 38 | 373 | 528 |
| CCl | 47 | 335 | 475 |
| CF2 | 50 | 325 | 460 |
| Cl2 | 70 | 275 | 389 |
| Br | 80 | 257 | 364 |

In order to determine the distance between opening 46 and surface 14, the lifetime of the active species must also be estimated, considering the reaction kinetics with other constituents, such as buffer gases, which are also in container 13. It will become apparent hereinbelow that the concentration and species of such buffer gases may also be used to select the distance that excited atoms of the etchant species will travel from opening 46 before recombining. Studies of the use of such buffer gases have been published relative to shock tubes and discharge flow systems. See *Reactive Intermediates in the Gas Phase, Generation and Monitoring*, D. W. Setser, ed. (Academic Press, New York, 1979), chapters 2 and 3; M. A. A. Clyne et al., *J. C. S. Farraday Discussions*, (1972), Vol. 53, pp. 82 et seq.; R. P. Wayne, *Advances in Photochemistry* (1969), pp. 311 et seq. Referring to the reaction in a three body collision, in the case of fluorine:

$$F + F + M \rightarrow F_2 + M \quad (5)$$

where M is a partner gas with the fluorine source. Choices for the partner, or buffer, gas represented by M in the above equation include helium, argon, nitrogen, and such other gases as may be incorporated into a plasma etch chamber with a reactant such as fluorine.

The particular species selected for the buffer gas can have a great influence on the rate constant $k_F$ for the reaction of equation (5) and, accordingly, on the distance that the reactant species can travel from opening 46 before recombination. In the above reaction of equation (5), when nitrogen is the buffer gas, the rate constant $k_F$ is approximately 8 E-23 cm$^6$mole$^{-2}$sec$^{-1}$. However, when argon is the buffer gas, the rate constant $k_F$ is on the order of 8.3 E-21 cm$^6$mole$^{-2}$sec$^{-1}$. Approximating the gas pressure outside of container 13 in the gas stream at 10 mTorr, the recombination time of the atoms can be found from:

$$1/t = (k_F)(n^2) \quad (6)$$

where n, the concentration of the fluorine atoms, is approximately 3.2 E16 times the pressure in torr.

For the case of the fluorine species with nitrogen as the buffer gas, using equation (6), the frequency of recombination 1/t is on the order of 8 E8 sec$^{-1}$. For the case where argon is the buffer gas, the frequency of recombination 1/t is on the order of 8.5 E6 sec$^{-1}$. Therefore, since the frequency of recombination is approximately two orders of magnitude higher for the nitrogen partner gas relative to the argon buffer gas, the distance that the fluorine atom will travel prior to recombination will be significantly larger where argon is the buffer gas relative to nitrogen. Using the velocity from Table I for argon, with the recombination frequency of 8.5 E6 sec$^{-1}$, the mean traveled distance for an excited fluorine atoms will be on the order of 65 microns for a 500 degK plasma, and 92 microns for the 1000 degK plasma.

It should be noted that the above-described calculations do not account for the adiabatic cooing of the gas stream as it exits opening 46. While this effect will tend to reduce the mean traveled distance for the excited gas, the above-calculated distances indicate that the distances between opening 46 and surface 14 are within the ability of modern manufacturing techniques to achieve. It is believed that any reduction in the distance due to adiabatic cooling can be accounted for by positioning opening 46 closer to surface 14, if necessary. It should further be noted that a plurality of excitable species may be included within container 13, such plurality of species having different mean distances to recombination. The use of selected buffer gases can thus provide the ability to tune the distances that various reactive species travel from opening 46, allowing for further control of the etch process.

In operation, a substrate surface 14 is placed on the support posts 24 through the port 26. The port 26 is closed and the vacuum pump 20 is initiated to lower the atmosphere within the enclosure 12 to the prescribed pressure. Gas from the pressurized gas source 16 is allowed to enter the container 13. The oscillator 40 provides RF energy to the container 13 by the wire coil 38. The RF energy excites the gas into a plasma state which reforms into excited gas just prior to exiting through the output opening 46.

The excited gas is accelerated through the output opening 46 toward the surface to be etched 14 by the pressure differential between the container 13 and the enclosure 12. The excited gas molecules interact with molecules on the surface to be etched 14, thus removing particles therefrom.

The container 13 provides a low cost device for directionally etching a surface. There is minimal unwanted damage to the surface. The system 10 is operated in a low pressure which aids the etching process. By varying the pressures, the output opening 46 or the shape of the container 13, the velocity of the excited gas may be varied to adjust for various types of gasses and various types of surface materials.

Although not shown, the container 13 may be used in combination with prior art devices such as an ion beam etcher. When combined with an ion beam etcher, the container 13 will produce etch rates far faster than possible with either device used individually.

Figure 3:
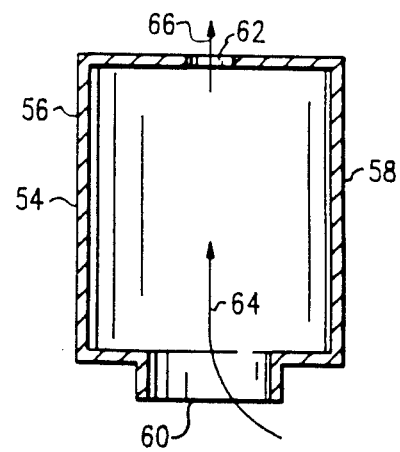
FIG. 3 is a cross-sectional view of an alternate embodiment of the container of the present invention.

FIG. 3 shows a cross-sectional view of an alternate embodiment of the container in accordance with the present invention. The container 54 has parallel sidewalls 56 and 58, an input opening 60 and an output opening 62. The input opening 60 is dimensionally larger than the output opening 62. Pressurized gas enters through the input opening 60 in the direction of arrow 64 where it is excited by RF energy from a wire coil, not shown. The excited gas exits through the output opening 62 in the direction of arrow 66 toward the surface to be etched in the same manner as previously discussed.

Although the present invention has been described with respect to a specific preferred embodiment thereof, various changes and modifications may be suggested to one skilled in the art, and it is intended that the present invention encompass such changes and modifications as fall within the scope of the appended claims.

What is claimed is:

1. Apparatus for exciting gas to etch a surface, comprising:
   an enclosure having a support for mounting a substrate having a surface to be etched;
   at least one container disposed within said enclosure, having an input opening for receiving a pressurized gas containing a species which chemically reacts with the material of the surface to be etched to form a volatile compound and having an output opening opposing the surface to be etched when the substrate is mounted on said support, said input opening being dimensionally larger than said output opening; and
   means for exciting said pressurized gas within said container to form a plasma;
   wherein said output opening is sized in such a manner that a substantial fraction of the electrons and ions of said plasma reunite to form molecules of said species in an excited state.

2. The apparatus of claim 1, wherein said container comprises heat resistant glass.

3. The apparatus of claim 1, wherein said container comprises quartz.

4. The apparatus of claim 1, wherein said container further includes sidewalls tapering inwardly proximate said outlet opening and terminating at said output opening.

5. The apparatus of claim 1, wherein said means for exciting said gas comprises a coil, surrounding said container, for receiving a radio frequency signal and for transmitting radio frequency energy into said container.

6. The apparatus of claim 5, further comprising means for applying a direct current bias near the output of said container.

7. The apparatus of claim 1, wherein a plurality of said containers are disposed within said enclosure, and wherein said means for exciting said pressurized gas excites the pressurized gas in each of said plurality of containers to form a plasma.

8. The apparatus of claim 7, wherein said means for exciting comprises a plurality of coils connected in series, each of said coils surrounding one of said plurality of containers.

9. Apparatus for etching a surface, comprising:
   at least one container having an input opening for receiving a pressurized gas containing a species which chemically reacts with the surface to be etched to form a volatile compound and an output opening for discharging;
   means for exciting said pressurized gas within said container to form a plasma;
   a vacuum enclosure surrounding said container and providing a mount for a substrate having the surface to be etched;
   wherein said output opening is sized smaller than said input opening so that a substantial portion of the ions and electrons in the plasma reunite to form molecules of said species in an excited state;
   and wherein said output opening is directed toward the location of a surface to be etched.

10. The apparatus of claim 9, wherein said output opening is forty microns wide.

11. The apparatus of claim 9, wherein said container is two to four centimeters wide.

12. The apparatus of claim 9, wherein said means for exciting comprises a coil, surrounding said container, for receiving a radio frequency signal and for transmitting radio frequency energy into said container.

13. The apparatus of claim 12, further comprising means for applying a direct current bias near the output of said container.

14. The apparatus of claim 9, wherein a plurality of said containers are disposed within said vacuum enclosure, the output opening of each of said containers directed to the surface to be etched, and wherein said means for exciting said pressurized gas excites the pressurized gas in each of said plurality of containers to form a plasma.

15. The apparatus of claim 14, wherein said means for exciting comprises a plurality of coils connected in series, each of said coils surrounding one of said plurality of containers.

16. The apparatus of claim 9, further comprising a plurality of said containers.

17. The apparatus of claim 16, wherein the output of each of said plurality of containers is directed at an angle to said surface.

18. The apparatus of claim 17, wherein said angle is adjustable for each of said plurality of containers.

19. A method of etching a surface of a substrate with an excited gas in a vacuum chamber, comprising the steps of:
   filling at least one container with a pressurized gas containing a species which is reactive with the material of said surface to be etched to form a volatile compound, said container disposed within said vacuum chamber and having sidewalls and an input opening opposite an output opening with said output opening smaller than said input opening;
   disposing a substrate having a surface to be etched in opposition to said output opening of said container; and
   exciting said pressurized gas in said container with radio frequency energy, such that said gas is transformed into plasma, a substantial portion of said plasma subsequently being reformed into excited gas due to the size of said output opening.

20. The method of claim 19, wherein the step of filling said container comprises filling said container with carbon tetrachloride.

21. The method of claim 19, wherein the step of filling said container comprises filling said container with halogenated gas.

22. The method of claim 19, wherein the step of exciting said pressurized gas comprises:
   energizing a coil disposed around said container with a radio frequency signal.

23. The method of claim 22, further comprising:
   biasing a portion of the chamber near said output opening with direct current bias.

24. The method of claim 19, wherein said pressurized gas further contains a buffer gas.

25. The method of claim 24, wherein said buffer gas is selected so that the mean distance traveled by said species in an excited state is greater than the distance between said opening and said surface of said substrate.

26. The method of claim 19, wherein said filling step fills a plurality of containers in said vacuum chamber with said pressurized gas.

27. The method of claim 26, further comprising:
   aiming the output openings of said plurality of containers at said surface of said substrate in such a manner as to improve the uniformity of the etch.

28. A method for etching a surface, comprising the steps of:
   maintaining a reduced pressure about at least one container with sidewalls and an input and an output, said output being smaller than said input, with said surface to be etched disposed opposing said output;
   filling said container with a pressurized gas through said input, said pressurized gas containing a species which is reactive with the material of said surface to be etched to form a volatile compound;
   wherein a substantial portion of said plasma is reformed into excited gas due to the size of said output opening;
   and wherein the pressure differential between inside said container and outside said container directs said excited gas at said surface to be etched.

29. The method of claim 28, wherein said reduced pressure is a vacuum of between $10^{-4}$ to $10^{-5}$ Torr about said container.

30. The method of claim 28 wherein said pressurized gas further contains a buffer gas.

31. The method of claim 30, wherein said buffer gas is selected so that the mean distance traveled by said species in an excited state is greater than the distance between said output and said surface.

32. The method of claim 28, wherein said filling step fills a plurality of containers within said reduced pressure.

33. The method of claim 32, further comprising:
   aiming the outputs of said plurality of containers at said surface in such a manner as to improve the uniformity of the etch.

* * * * *